(12) United States Patent
Wang et al.

(10) Patent No.: US 11,127,806 B2
(45) Date of Patent: Sep. 21, 2021

(54) WIRING STRUCTURE, DISPLAY SUBSTRATE AND DISPLAY DEVICE

(71) Applicants: BOE TECHNOLOGY GROUP CO., LTD., Beijing (CN); CHENGDU BOE OPTOELECTRONICS TECHNOLOGY CO., LTD., Sichuan (CN)

(72) Inventors: Benlian Wang, Beijing (CN); Li Wang, Beijing (CN); Yipeng Chen, Beijing (CN); Yueping Zuo, Beijing (CN); Zheng Liu, Beijing (CN)

(73) Assignees: BOE TECHNOLOGY GROUP CO., LTD., Beijing (CN); CHENGDU BOE OPTOELECTRONICS TECHNOLOGY CO., LTD., Sichuan (CN)

( * ) Notice: Subject to any disclaimer, the term of this patent is extended or adjusted under 35 U.S.C. 154(b) by 715 days.

(21) Appl. No.: 15/779,664

(22) PCT Filed: Nov. 7, 2017

(86) PCT No.: PCT/CN2017/109710
§ 371 (c)(1),
(2) Date: May 29, 2018

(87) PCT Pub. No.: WO2018/196324
PCT Pub. Date: Nov. 1, 2018

(65) Prior Publication Data
US 2021/0167158 A1 Jun. 3, 2021

(30) Foreign Application Priority Data
Apr. 28, 2017 (CN) .......................... 201710294993.1

(51) Int. Cl.
*H01L 27/32* (2006.01)
*H01L 51/00* (2006.01)

(52) U.S. Cl.
CPC ...... *H01L 27/3276* (2013.01); *H01L 51/0097* (2013.01); *H01L 2251/5338* (2013.01)

(58) Field of Classification Search
None
See application file for complete search history.

(56) References Cited

U.S. PATENT DOCUMENTS

2007/0020445 A1* 1/2007 Liu .......................... D03D 9/00
428/195.1
2012/0062447 A1 3/2012 Tseng et al.
(Continued)

FOREIGN PATENT DOCUMENTS

CN 105144270 A 12/2015
CN 205140985 4/2016
(Continued)

OTHER PUBLICATIONS

First Office Action for Chinese Patent Application No. 201710294993.1 dated Nov. 5, 2018.
(Continued)

*Primary Examiner* — J. E. Schoenholtz
(74) *Attorney, Agent, or Firm* — Calfee, Halter & Griswold LLP

(57) ABSTRACT

A wiring structure, a display substrate and a display device are provided, which belongs to the field of display technology. The wiring structure includes a plurality of hollow patterns connected successively. Each of the hollow patterns includes a first conductive part having a first pattern and a second conductive part having a second pattern. The first conductive part and the second conductive part are connected with each other, and the first pattern and the second
(Continued)

pattern have different shapes. Because the wiring structure includes a plurality of hollow patterns connected successively, and the first conductive part and the second conductive part in each hollow pattern have different shapes, even if the conductive part of one shape in the wiring structure is broken in the process of bending, stretching and twisting, the conductive part of the other shape can also ensure good conductivity for the wiring structure.

14 Claims, 2 Drawing Sheets

(56) References Cited

U.S. PATENT DOCUMENTS

| | | |
|---|---|---|
| 2013/0034971 A1 | 2/2013 | Tsai et al. |
| 2014/0216786 A1 | 8/2014 | Zhou et al. |
| 2014/0217373 A1 | 8/2014 | Youn et al. |
| 2015/0179728 A1 | 6/2015 | Kwon et al. |
| 2015/0378484 A1 | 12/2015 | Orita et al. |
| 2016/0087024 A1* | 3/2016 | Son .................. H01L 51/0097 257/40 |
| 2016/0093644 A1 | 3/2016 | Ki et al. |
| 2016/0103534 A1 | 4/2016 | Zhang et al. |
| 2017/0023816 A1 | 1/2017 | Maede et al. |
| 2017/0192574 A1 | 7/2017 | Koike et al. |
| 2017/0322670 A1 | 11/2017 | Wang et al. |

FOREIGN PATENT DOCUMENTS

| | | |
|---|---|---|
| CN | 205140985 U | 4/2016 |
| CN | 205870152 | 8/2016 |
| CN | 106020528 A | 10/2016 |
| CN | 106371251 A | 2/2017 |
| CN | 107039396 | 8/2017 |
| JP | 2004119871 A | 4/2004 |
| JP | 2009259929 A | 11/2009 |
| WO | 2014/117478 | 8/2014 |
| WO | 2014/136455 | 9/2014 |
| WO | 2016039047 A1 | 3/2016 |

OTHER PUBLICATIONS

Office action from Chinese Application No. 201910847817.5 dated Sep. 1, 2020.
International Search Report and Written Opinion from PCT/CN2017/109710 dated Feb. 2, 2018 along with English translation of Written Opinion.
Office Action of Application No. 201910847817.5 dated Apr. 19, 2021 (18 pages).

* cited by examiner

WIRING STRUCTURE, DISPLAY SUBSTRATE AND DISPLAY DEVICE

CROSS REFERENCE OF RELATED APPLICATION

The present application is the U.S. national phase entry of PCT/CN2017/109,710, with an international filling date of Nov. 7, 2017, which claims the right of priority to the Chinese Patent Application No. 201710294993.1 filed on Apr. 28, 2017, the entire disclosure of which is incorporated herein by reference.

TECHNICAL FIELD

This disclosure relates to the field of display technology, particularly to a wiring structure, a display substrate and a display device.

BACKGROUND

In order to manufacture a flexible display device, many display components made of organic materials have been developed, such as organic light emitting layers, organic passivation layers and polymer substrates (e.g. PI substrates) as flexible substrates. But it is difficult to replace the metal wiring in the display device with a wiring made of organic materials, because the electrical conductivity of organic materials is far lower than the metal wiring. However, when the flexible display device is bended, the metal wiring in the display panel might be broken (the broken wiring ratio is about 1%), which results in failure of the display device.

SUMMARY

The wiring structure provided by an embodiment of this disclosure comprises a plurality of hollow patterns connected successively, each of the hollow patterns comprising a first conductive part having a first pattern and a second conductive part having a second pattern, the first conductive part and the second conductive part are connected with each other, and the first pattern and the second pattern have different shapes.

In some embodiments, the first conductive part and the second conductive part in each hollow pattern both have a first terminal and a second terminal, wherein the first terminal of the first conductive part is connected with the first terminal of the second conductive part, and the second terminal of the first conductive part is connected with the second terminal of the second conductive part.

In some embodiments, the first conductive part and the second conductive part are connected with each other to form a closed pattern.

In some embodiments, for two adjacent hollow patterns, the first terminal of the first conductive part in one of the hollow patterns is connected with the second terminal of the first conductive part in the other hollow pattern, and the first terminal of the second conductive part in the one of the hollow patterns is connected with the second terminal of the second conductive part in the other hollow pattern.

In some embodiments, any two adjacent hollow patterns form a centrally symmetric pattern.

In some embodiments, the first conductive part has a polygonal line shape, and the second conductive part has a circular arc shape.

In some embodiments, there are at least three connection nodes between the first conductive part and the second conductive part in each of the hollow patterns, and the at least three connection nodes are not in a same straight line.

Particularly, in some embodiments, there are three connection nodes between the first conductive part and the second conductive part in each of the hollow patterns, the first conductive part comprises a first sub-conductive portion and a second sub-conductive portion, each of the first sub-conductive portion, the second sub-conductive portion and the second conductive part has a first terminal and a second terminal. In each of the hollow patterns, the first terminal of the first sub-conductive portion is connected with the first terminal of the second conductive part, the second terminal of the first sub-conductive portion is connected with the first terminal of the second sub-conductive portion, and a connection node of the first sub-conductive portion and the second sub-conductive portion is connected to a position between the first terminal and the second terminal of the second conductive part, the second terminal of the second sub-conductive portion is connected with the second terminal of the second conductive part.

In some embodiments, for any two adjacent hollow patterns, a connection node of the first terminal of the first sub-conductive portion in one of the two hollow patterns and the first terminal of the second conductive part in the one of the two hollow patterns is connected with a connection node of the second terminal of the second sub-conductive portion in the other hollow pattern and the second terminal of the second conductive part in the other hollow pattern.

In some embodiments, each of the first sub-conductive portion, the second sub-conductive portion and the second conductive part has a circular arc shape.

In some embodiments, any two adjacent hollow patterns form an axially symmetric pattern.

In some embodiments, the first conductive parts in the plurality of hollow patterns form an integrated structure.

In some embodiments, the second conductive parts in the plurality of hollow patterns form an integrated structure.

Another embodiment of this disclosure provides a display substrate, comprising a substrate and a wiring structure as stated in any of the previous embodiments arranged on the substrate.

In some embodiments, the substrate comprises a flexible substrate.

Another embodiment of this disclosure provides a display device, comprising the display substrate provided by the preceding embodiment.

DETAILED DESCRIPTION OF EMBODIMENTS

In order to enable the skilled person in the art to better understand the technical solutions of embodiments of this disclosure, next, the embodiments of this disclosure will be described in more details in conjunction with the drawings and the examples.

As shown in FIGS. 1-4, an embodiment of the disclosure provides a wiring structure, which comprises a plurality of hollow patterns 1 connected successively. Each hollow pattern 1 comprises a first conductive part 11 having a first pattern and a second conductive part 12 having a second pattern. The first conductive part 11 and the second conductive part 12 are connected with each other, and the first pattern and the second pattern have different shapes.

Because the wiring structure provided by the embodiment of the disclosure comprises a plurality of hollow patterns 1 connected successively, compared with the conventional linear type wiring structure, the wiring structure provided by the embodiment of this disclosure can release the stress through the hollow patterns 1 in the process of bending, stretching and twisting, so as to avoid breaking of the wiring structure that may result in failure of the device on the substrate that applies the wiring structure. Moreover, the first conductive part 11 and the second conductive part 12 in each hollow pattern 1 have different shapes, so, even if the conductive part of one shape in the wiring structure is broken in the process of bending, stretching and twisting, the conductive part of the other shape can ensure good conductivity for the wiring structure. Particularly for a flexible substrate, due to its characteristic of being easily bending, using the wiring structure proposed in the embodiment of this disclosure can improve the yield of the flexible substrate greatly.

Next, the specific structure of the wiring structure in the embodiments will be explained in conjunction with specific examples.

Figure 1:
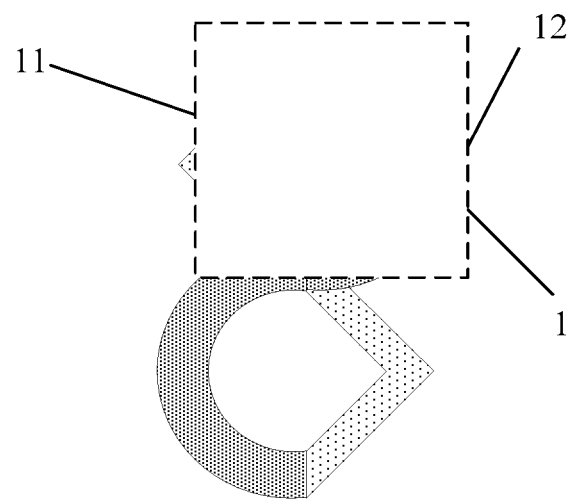
FIG. 1 is a schematic view of a wiring structure provided by an embodiment of this disclosure.
Figure 2:
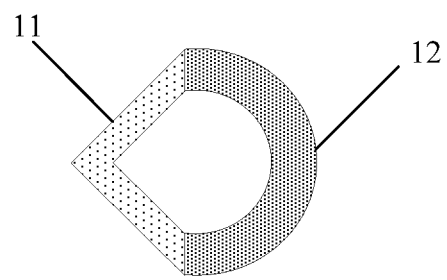
FIG. 2 is a schematic view of a hollow pattern in FIG. 1.

In an example, as shown in FIG. 1 and FIG. 2, the first conductive part 11 and the second conductive part 12 in each hollow pattern 1 of the wiring structure both have a first terminal and a second terminal. The first terminal of the first conductive part 11 is connected with the first terminal of the second conductive part 12, and the second terminal of the first conductive part 11 is connected with the second terminal of the second conductive part 12. That is, the first conductive part 11 and the second conductive part 12 are connected with each other to form a closed hollow pattern 1. The hollow pattern 1 has two connection nodes. Moreover, for two adjacent hollow patterns, the first terminal of the first conductive part 11 in one of the hollow patterns is connected with the second terminal of the first conductive part in the other hollow pattern, and the first terminal of the second conductive part 12 in one of the hollow patterns is connected with the second terminal of the second conductive part in the other hollow pattern. That is to say, in the wiring structure, the first conductive parts 11 in any adjacent hollow patterns 1 are connected end to end, and the second conductive parts 12 in any adjacent hollow patterns 1 are connected end to end.

In some embodiments, all the first conductive parts 11 in the hollow patterns can be an integrated structure, and all the second conductive parts 12 can be an integrated structure. In this way, the manufacture of the first conductive part 11 and the second conductive part 12 can be facilitated, and the productivity can be improved greatly.

Further, in some embodiments, any two adjacent hollow patterns 1 form a centrally symmetric pattern, with a connection node of the two hollow patterns being a center.

In the examples of FIG. 1 and FIG. 2, the first conductive part 11 is in a polygonal line shape, and the second conductive part 12 is in a circular arc shape. As shown in FIG. 1, a plurality of polygonal line shaped first conductive parts 11 are connected end to end, forming a shape similar to a triangular wave, and a plurality of circular arc shaped second conductive parts 12 are connected end to end to form a shape similar to a sinusoidal wave. Here, the example of FIG. 1 can be considered as combining and splicing two sub-wirings of different shapes into one wiring structure 1, hence, even if the sub-wiring of one shape is broken, the connecting function can also be maintained based on the sub-wiring of the other shape, so as to avoid the problem of failure of the wiring structure due to bending and breaking.

Figure 3:
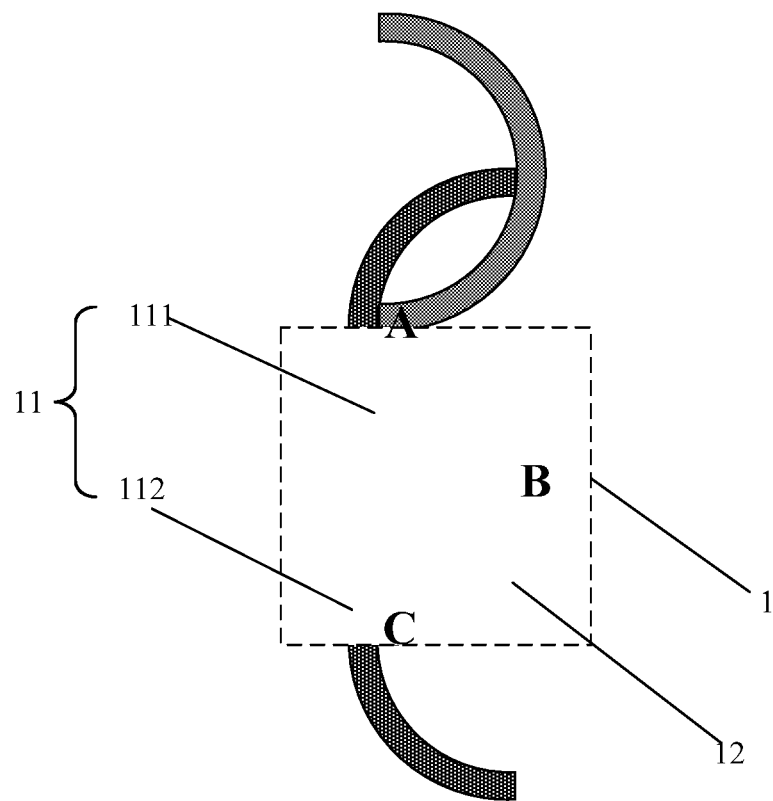
FIG. 3 is a schematic view of a wiring structure provided by another embodiment of this disclosure.
Figure 4:
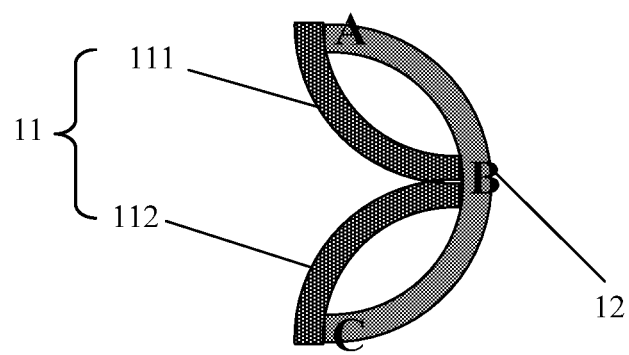
FIG. 4 is a schematic view of a hollow pattern in FIG. 3.

In another embodiment, as shown in FIG. 3 and FIG. 4, there are at least three connection nodes between the first conductive part 11 and the second conductive part 12 in each hollow pattern 1, and these connection nodes are not in a same straight line. In FIG. 3 and FIG. 4, for example, the number of the connection nodes between the first conductive part 11 and the second conductive part 12 in each hollow pattern 1 is three. The first conductive part 11 comprises a first sub-conductive portion 111 and a second sub-conductive portion 112. Each of the first sub-conductive portion 111, the second sub-conductive portion 112, and the second conductive part 12 has two terminals (i.e., a first terminal and a second terminal). In each of the hollow patterns, the first terminal of the first sub-conductive portion 111 is connected with the first terminal of the second conductive part 12, the second terminal of the first sub-conductive portion 111 is connected with the first terminal of the second sub-conductive portion 112, and the connection node of the first sub-conductive portion 111 and the second sub-conductive portion 112 is connected to a portion between the first terminal and the second terminal of the second conductive part 12. The second terminal of the second sub-conductive portion 112 is connected with the second terminal of the second conductive part 12. For any two adjacent hollow patterns 1, a connection node of the first terminal of the first sub-conductive portion 111 in one of the hollow patterns and the first terminal of the second conductive part 12 in the one of the hollow patterns is connected with a connection node of the second terminal of the second sub-conductive portion in the other hollow pattern and the second terminal of the second conductive part in the other hollow pattern.

In the example of the hollow pattern as shown in FIG. 4, the first sub-conductive portion 111 and the second sub-conductive portion 112 of the first conductive part 11, as well as the second conductive part 12 are all in a circular arc shape. Here, it can be seen that there are three connection nodes between the first conductive part 11 and the second conductive part 12 in each hollow pattern 1, i.e., nodes A, B, C as shown in the figure. The nodes A and B are in a same straight line, while the nodes A, B, C are not in a same straight line. Hence, even if the node A and/or the node B are broken, the node C may still keep connection function because it is not in the same straight line as the nodes A and B, so as to avoid failure of the wiring structure.

In some embodiments, any two adjacent hollow patterns 1 form an axially symmetric pattern (the axis of symmetry is a straight line that is perpendicular to the extending direction of the wiring structure and passes through the connection node between adjacent hollow patterns).

Further, in some embodiments, the first conductive part 11 in each hollow pattern of the wiring structure is an integrated structure, and each of the second conductive part 12 is an integrated structure. In this way, the manufacture of the first conductive part 11 and the second conductive part 12 can be facilitated, and the productivity can be improved greatly.

Another embodiment of the disclosure provides a display substrate, comprising a substrate and a wiring structure arranged on the substrate. The wiring structure can be a wiring structure described in any of the preceding embodiments.

The display substrate in this embodiment can be a flexible substrate, i.e., the material for the substrate is a flexible material, for example, polyimide (PI) etc.

Because the wiring structure in the display substrate in this embodiment comprises a plurality of hollow patterns, when the display substrate is bended, stretched or twisted, the wiring structure can release the stress through the hollow patterns therein, so as to avoid breaking which may result in failure of the device on the substrate that applies the wiring structure. Particularly for a flexible substrate, due to its characteristic of being easily bended, using the wiring structure described in the embodiment can improve the yield of the flexible substrate greatly.

An embodiment of the disclosure provides a display device, comprising the display substrate stated in the above embodiment. The display device can be a liquid crystal display device or an electroluminescent display device, e.g., any product or component having the display function such as a liquid crystal panel, electronic paper, an OLED panel, a mobile phone, a panel computer, a television, a display, a laptop, a digital photo frame, a navigator etc.

It could be understood that what are stated above are only exemplary embodiments used for explaining the principle of the disclosure. However, the invention is not so limited. For the ordinary skilled person in the art, various modifications and improvements can be made without departing from the spirit and the essence of the invention. These modifications and improvements shall also be regarded as falling into the scope of the invention.

The invention claimed is:

1. A wiring structure, comprising a plurality of hollow patterns connected successively, each hollow pattern of the hollow patterns comprising a first conductive part having a first pattern and a second conductive part having a second pattern, wherein the first conductive part and the second conductive part are connected with each other, and the first pattern and the second pattern have different shapes,
wherein the first conductive part comprises a bending segment, the second conductive part comprises a circular arc segment, each of the bending segment and the circular arc segment comprises a first terminal and a second terminal, a length of each of the bending segment and the circular arc segment extends between respective first terminal and respective second terminal,
wherein the first terminal of the bending segment is connected to the first terminal of the circular arc segment, the second terminal of the bending segment is connected to the second terminal of the circular arc segment, such that the bending segment and the circular arc segment form the hollow pattern.

2. The wiring structure according to claim 1, wherein for two adjacent hollow patterns, the first terminal of the bending segment in one of the hollow patterns is connected with the second terminal of the bending segment in the other hollow pattern, and the first terminal of the circular arc segment in the one of the hollow patterns is connected with the second terminal of the circular arc segment in the other hollow pattern.

3. The wiring structure according to claim 1, wherein any two adjacent hollow patterns form a centrally symmetric pattern.

4. A wiring structure, comprising a plurality of hollow patterns connected successively, each hollow pattern of the hollow patterns comprising a first conductive part having a first pattern and a second conductive part having a second pattern, wherein the first conductive part and the second conductive part are connected with each other, and the first pattern and the second pattern have different shapes, wherein the first conductive part comprises a first sub-conductive portion and a second sub-conductive portion, each of the first sub-conductive portion, the second sub-conductive portion and the second conductive part comprises a first terminal and a second terminal, and a length of each of the first sub-conductive portion, the second sub-conductive portion and the second conductive part extends between respective first terminal and respective second terminal,
wherein the first conductive part and the second conductive part of each hollow pattern of the hollow patterns are connected with each other to form at least three connection nodes, the at least three connection nodes are not in a same straight line,
wherein in each hollow pattern of the hollow patterns, the first terminal of the first sub-conductive portion is connected with the first terminal of the second conductive part to form a first connection node of the at least three connection nodes, the second terminal of the first sub-conductive portion is connected with the first terminal of the second sub-conductive portion to form a second connection node of the at least three connection nodes, and the second connection node is connected to a position between the first terminal and the second terminal of the second conductive part, the second terminal of the second sub-conductive portion is connected with the second terminal of the second conductive part to form a third connection node of the at least connection nodes.

5. The wiring structure according to claim 4, wherein for any two adjacent hollow patterns, a connection node of the first terminal of the first sub-conductive portion in one of the two hollow patterns and the first terminal of the second conductive part in the one of the two hollow patterns is connected with a connection node of the second terminal of the second sub-conductive portion in the other hollow pattern and the second terminal of the second conductive part in the other hollow pattern.

6. The wiring structure according to claim 5, wherein each of the first sub-conductive portion, the second sub-conductive portion and the second conductive part has a circular arc shape.

7. The wiring structure according to claim 1, wherein any two adjacent hollow patterns form an axially symmetric pattern.

8. The wiring structure according to claim 1, wherein the first conductive parts in the plurality of hollow patterns form an integrated structure.

9. The wiring structure according to claim 1, wherein the second conductive parts in the plurality of hollow patterns form an integrated structure.

10. A display substrate, comprising a substrate and the wiring structure according to claim 1 arranged on the substrate.

11. The display substrate according to claim 10, wherein the substrate comprises a flexible substrate.

12. A display device, comprising the display substrate according to claim 10.

13. The display device according to claim 12, wherein the substrate comprises a flexible substrate.

14. The display substrate according to claim 10, wherein for two adjacent hollow patterns, the first terminal of the bending segment in one of the hollow patterns is connected with the second terminal of the bending segment in the other hollow pattern, and the first terminal of the circular arc segment in the one of the hollow patterns is connected with the second terminal of the circular arc segment in the other hollow pattern.

* * * * *